United States Patent
Pal et al.

(10) Patent No.: US 12,265,114 B2
(45) Date of Patent: Apr. 1, 2025

(54) SYSTEM AND METHOD FOR PREDICTING ELECTRICAL ARCS IN AN ELECTRICAL CIRCUIT

(71) Applicant: ABB Schweiz AG, Baden (CH)

(72) Inventors: Mayukha Pal, Sangareddy (IN); Vedala Sai Ashok, Hyderabad (IN)

(73) Assignee: ABB Schweiz AG, Baden (CH)

( * ) Notice: Subject to any disclaimer, the term of this patent is extended or adjusted under 35 U.S.C. 154(b) by 232 days.

(21) Appl. No.: 17/862,683

(22) Filed: Jul. 12, 2022

(65) Prior Publication Data

US 2024/0019481 A1    Jan. 18, 2024

(51) Int. Cl.
*G01R 31/14* (2006.01)
*G06F 17/16* (2006.01)
*H02H 1/00* (2006.01)
*H02H 7/26* (2006.01)

(52) U.S. Cl.
CPC .............. *G01R 31/14* (2013.01); *G06F 17/16* (2013.01); *H02H 1/0015* (2013.01); *H02H 1/0092* (2013.01); *H02H 7/26* (2013.01)

(58) Field of Classification Search
CPC ........ G01R 31/14; G06F 17/16; H02H 1/0015
See application file for complete search history.

(56) References Cited

U.S. PATENT DOCUMENTS

2018/0173173 A1*  6/2018  Leonard ............. G05B 13/0265
2020/0218776 A1*  7/2020  Shah ........................ G06F 17/16

OTHER PUBLICATIONS

Shen et al., "Wavelet-Analysis-Based Singular-Value-Decomposition Algorithm for Weak Arc Fault Detection via Current Amplitude Normalization," May 19, 2021, IEEE Access, vol. 9, pp. 71535-71552. (Year: 2021).*

* cited by examiner

*Primary Examiner* — Ricky Go
(74) *Attorney, Agent, or Firm* — Leydig, Voit & Mayer, Ltd.

(57) ABSTRACT

A system and method for predicting electrical arcs in an electrical circuit is provided. A time series data of the electrical circuit is received by a prediction system which is configured to detect an electrical signature indicating an upcoming electrical arc. The prediction system constructs Hankel matrix using the time series data which is decomposed using SVD to obtain a singular vector in which delay coordinate embedding is performed to generate reconstructed singular vector which includes plurality of eigen time delay coordinates. Further, threshold coefficient 'r' is calculated from the reconstructed singular vector. A first set of eigen time delay coordinates is identified in the reconstructed singular vector based on 'r' which are $r^{th}$ eigen time delay coordinates. A rate of change in magnitude of $r^{th}$ eigen time delay coordinates is calculated to detect the electrical signature based on which the upcoming electrical arc is predicted.

17 Claims, 4 Drawing Sheets

SYSTEM AND METHOD FOR PREDICTING ELECTRICAL ARCS IN AN ELECTRICAL CIRCUIT

TECHNICAL FIELD

The present disclosure generally relates to arc faults and more particularly, to a system and method for predicting electrical arcs in an electrical protection device connected in an electrical circuit.

BACKGROUND

Electrical hazards such as, fires due to electrical failure or malfunction primarily involve some form of electrical arcing in a circuit. An electric arc is a luminous electric discharge between two electrodes or electrical points causing extreme rise in temperature. Electrical arcs may be series arc faults which occur due to loose connections, or parallel arc faults that occur between two phases, for example, or between phase and ground, and are often a result of degraded insulation. Such electrical arcs are fatal in nature as they may cause damage to electrical protection devices and equipment and may also cause severe burn injuries and in extreme cases loss of human lives due to fire. The most common causes of electrical arcs include worn contacts (i.e., loose wires, damaged wires, or corroded wires) in electrical equipment, damage to insulation, break in cable and loose connections.

Conventionally, residential, and commercial establishments mostly use load centers integrated with electronics trip-based arc protection devices like Arc Fault Circuit Interrupter (AFCI), Arc Fault Detection Device (AFDD), Arc vault devices, and the like for safe distribution of power supply to appliances and ensure protection from electrical damage caused due to arc events. Generally, these protection devices are designed to handle or quench the electrical arc when the protection device faces the arcing event. In other words, the electrical protection devices encounter the arc event in the electrical circuit and then handle the electrical arc by breaking the circuit to protect equipment and human life. In some cases, if the electrical protection device is unable to handle the electrical arc or misses the electrical arc, there may be damage to assets and loss of human life. The conventional systems act only after the electrical arc has occurred which can cause damage to equipment and sometimes humans as discussed above.

In view of the above discussion, there is a need to predict an upcoming electrical arc events in electrical protection devices to handle the electrical arc.

BRIEF SUMMARY OF THE DISCLOSURE

In an embodiment, a method for predicting electrical arcs in an electrical protection device connected in an electrical circuit is disclosed. The method includes receiving, by a prediction system, time series data of the electrical circuit. The method includes detecting, by the prediction system, an electrical signature in the time series data indicating an upcoming electrical arc in the electrical circuit by performing the following steps: (1) constructing a Hankel matrix using the time series data; (2) performing a singular value decomposition on the Hankel matrix to obtain at least one singular vector, (3) performing delay coordinate embedding on the at least one singular vector to generate at least one reconstructed singular vector, wherein the at least one reconstructed singular vector comprises a plurality of eigen time delay coordinates, (4) calculating a threshold coefficient 'r' from the at least one reconstructed singular vector, wherein the threshold coefficient 'r' indicates an optimal location in the at least one reconstructed singular vector representing a change in state of the electrical circuit, (5) identifying a first set of eigen time delay coordinates among the plurality of eigen time delay coordinates in the at least one reconstructed singular vector based on the threshold coefficient 'r', wherein $r^{th}$ eigen time delay coordinates constitute the first set of eigen time delay coordinates, and (6) computing a rate of change in magnitude of the first set of eigen time delay coordinates to detect the electrical signature. Further, the method includes predicting, by the prediction system, the upcoming electrical arc in the electrical circuit based on the electrical signature.

In another embodiment, a prediction system for predicting electrical arcs in an electrical protection device connected in an electric circuit is disclosed. The prediction system includes a memory and a processor. The memory is configured to store instructions and the processor is configured to execute the instructions stored in the memory and thereby cause the prediction system to perform the method. The prediction system is caused to receive time series data of the electrical circuit. The prediction system is caused to detect an electrical signature in the time series data indicating an upcoming electrical arc in the electrical circuit by performing the following steps: (1) constructing a Hankel matrix using the time series data, (2) performing a singular value decomposition on the Hankel matrix to obtain at least one singular vector, (3) performing delay coordinate embedding on the at least one singular vector to generate at least one reconstructed singular vector, wherein the at least one reconstructed singular vector comprises a plurality of eigen time delay coordinates, (4) calculating a threshold coefficient 'r' from the at least one reconstructed singular vector, wherein the threshold coefficient 'r' indicates an optimal location in the at least one reconstructed singular vector representing a change in state of the electrical circuit, (5) identifying a first set of eigen time delay coordinates among the plurality of eigen time delay coordinates in the at least one reconstructed singular vector based on the threshold coefficient 'r', wherein $r^{th}$ eigen time delay coordinates constitute the first set of eigen time delay coordinates, and (6) computing a rate of change in magnitude of the first set of eigen time delay coordinates to detect the electrical signature. The prediction system is caused to predict the upcoming electrical arc in the electrical circuit based on the electrical signature.

In yet another embodiment, a non-transitory computer-readable medium is disclosed. The non-transitory computer-readable medium stores instructions for predicting electrical arcs in an electrical protection device connected in an electrical circuit. The instructions, when executed by a processor, cause a prediction system to perform a method. The method includes receiving time series data of the electrical circuit. The method includes detecting an electrical signature in the time series data indicating an upcoming electrical arc in the electrical circuit by performing the following steps: (1) constructing a Hankel matrix using the time series data, (2) performing a singular value decomposition on the Hankel matrix to obtain at least one singular vector, (3) performing delay coordinate embedding on the at least one singular vector to generate at least one reconstructed singular vector, wherein the at least one reconstructed singular vector comprises a plurality of eigen time delay coordinates, (4) calculating a threshold coefficient 'r' from the at least one reconstructed singular vector, wherein the threshold coefficient 'r' indicates an optimal location in the at least one reconstructed singular vector representing a change in state of the electrical circuit, (5) identifying a first set of eigen time delay coordinates among the plurality of eigen time delay coordinates in the at least one reconstructed singular vector based on the threshold coefficient 'r', wherein rth eigen time delay coordinates constitute the first set of eigen time delay coordinates, and (6) computing a rate of change in magnitude of the first set of eigen time delay coordinates to detect the electrical signature. Further, the method includes predicting the upcoming electrical arc in the electrical circuit based on the electrical signature.

In still another embodiment, an electrical protection device for predicting electrical arcs is disclosed. The electrical protection device includes a memory, one or more processors and an actuator. The memory is configured to store instructions. The one or more processors are configured to execute the instructions stored in the memory and thereby cause the electrical protection device to perform the method. The electrical protection device is caused to receive time series data of an electrical circuit. The electrical protection device is caused to detect an electrical signature in the time series data indicating an upcoming electrical arc in the electrical circuit by performing the following steps: (1) constructing a Hankel matrix using the time series data; (2) performing a singular value decomposition on the Hankel matrix to obtain at least one singular vector, (3) performing delay coordinate embedding on the at least one singular vector to generate at least one reconstructed singular vector, wherein the at least one reconstructed singular vector comprises a plurality of eigen time delay coordinates, (4) calculating a threshold coefficient 'r' from the at least one reconstructed singular vector, wherein the threshold coefficient 'r' indicates an optimal location in the at least one reconstructed singular vector representing a change in state of the electrical circuit, (5) identifying a first set of eigen time delay coordinates among the plurality of eigen time delay coordinates in the at least one reconstructed singular vector based on the threshold coefficient 'r', wherein $r^{th}$ eigen time delay coordinates constitute the first set of eigen time delay coordinates, and (6) computing a rate of change in magnitude of the first set of eigen time delay coordinates to detect the electrical signature. The electrical protection device is caused to predict the upcoming electrical arc in the electrical circuit based on the electrical signature. The actuator is configured to receive a control signal based on the prediction from the prediction system and thereafter, the actuator is operated based on the prediction for quenching the electrical arc.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The accompanying drawings, which are incorporated in and constitute a part of this disclosure, illustrate exemplary embodiments and, together with the description, serve to explain the disclosed principles. The same numbers are used throughout the figures to reference like features and components. Some embodiments of device and/or methods in accordance with embodiments of the present subject matter are now described, by way of example only, and with reference to the accompanying figures, in which.

It should be appreciated by those skilled in the art that any block diagrams herein represent conceptual views of illustrative systems embodying the principles of the present subject matter. Similarly, it will be appreciated that any flow charts, flow diagrams, state transition diagrams, pseudo code, and the like represent various processes which may be substantially represented in computer readable medium and executed by a computer or processor, whether or not such computer or processor is explicitly shown.

DETAILED DESCRIPTION

In the present document, the word "exemplary" is used herein to mean "serving as an example, instance, or illustration". Any embodiment or implementation of the present subject matter described herein as "exemplary" is not necessarily to be construed as preferred or advantageous over other embodiments.

While the disclosure is susceptible to various modifications and alternative forms, specific embodiment thereof has been shown by way of example in the drawings and will be described in detail below. It should be understood, however that it is not intended to limit the disclosure to the particular forms disclosed, but on the contrary, the disclosure is to cover all modifications, equivalents, and alternative falling within the spirit and the scope of the disclosure.

The terms "comprises", "comprising", or any other variations thereof, are intended to cover a non-exclusive inclusion, such that a setup, device, or method that comprises a list of components or steps does not include only those components or steps but may include other components or steps not expressly listed or inherent to such setup or device or method. In other words, one or more elements in a device or system or apparatus proceeded by "comprises . . . a" does not, without more constraints, preclude the existence of other elements or additional elements in the device or system or apparatus.

In the following detailed description of the embodiments of the disclosure, reference is made to the accompanying drawings that form a part hereof, and in which are shown by way of illustration specific embodiments in which the disclosure may be practiced. These embodiments are described in sufficient detail to enable those skilled in the art to practice the disclosure, and it is to be understood that other embodiments may be utilized and that changes may be made without departing from the scope of the present disclosure. The following description is, therefore, not to be taken in a limiting sense.

Figure 1:
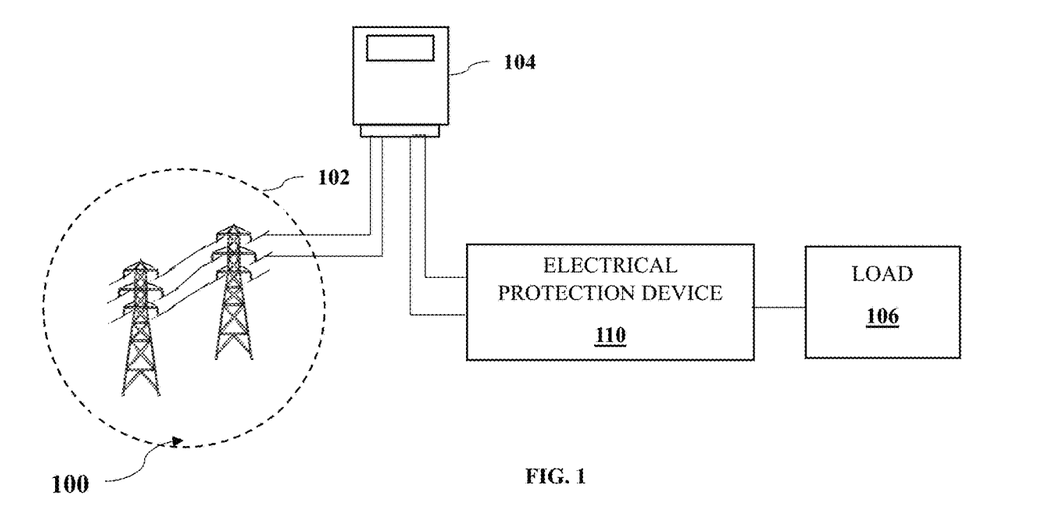
FIG. 1 is a simplified schematic block diagram of an environment, in which at least some example embodiments of an electrical protection device according to the present disclosure can be implemented.

FIG. 1 illustrates a simplified representation of an environment 100, in which example embodiments of an electrical protection device can be implemented. The environment 100 exemplarily depicts power supply to a load 106. The term 'load' as used herein may refer to one or more equipment used in a residence, an industry, a power plant, a substation, a distribution station, or any other place employing equipment which require electricity. More specifically, power purchased from a utility company 102 supplies the load 106 and a meter 104 that records the electrical energy used by the load 106 and is distributed from a load center (not shown in FIG. 1) via an electrical circuit with various branch circuits for different equipment of the load 106. In an illustrative example, electrical energy for a residence may be distributed by an electrical circuit to different branch circuits for lighting, appliances, and electrical outlets. For example, the branch circuits may supply power to various home appliances in the residence such as, but not limited to, a space heater, an air conditioner, refrigerator, washing machine, water pump, a television, a microwave oven, and the like which constitute the load 106.

Conventionally, residential, and commercial establishments mostly use load centers integrated with electronics trip-based arc protection devices like, an electrical protection device 110 shown in FIG. 1. The electrical protection device 110 is electrically coupled to the electrical circuit and is configured to protect the electrical circuit from electrical damage caused by overload, short circuit, arc events. It shall be noted that the environment 100 is shown for exemplary purposes and as such, only elements essential to the invention are disclosed and other elements are not disclosed. However a person skilled in the art will understand that various other elements may be included in the electrical protection device 110, between the electrical protection device 110 and the grid 102 and between the electrical protection device 110 and the load 106.

In an example scenario, a home fire may be caused due to electrical failure or malfunction primarily involving some form of electrical arcing in the electrical circuit. An electric arc is a luminous electric discharge between two electrodes or points causing extreme high temperature. Such electrical arcs are very fatal in nature as they may cause damage to electrical protection devices, electrical equipment, severe burn injuries and in some cases loss of human lives. The most common causes of electrical arcs include worn contacts (i.e., loose wires, damaged wires, or corroded wires) in electrical equipment, damage to insulation, break in cable and loose connections. Some examples of the electrical protection device 110 include, but not limited to, Arc Fault Circuit Interrupter (AFCI), Arc Fault Detection Device (AFDD), Arc vault devices, switchgear, and the like for safe distribution of power supply to home appliances.

Various embodiments of the present disclosure disclose a system and method for predicting electrical arcs in an electrical protection device connected in an electrical circuit. Accordingly, an upcoming electrical arc in the electrical protection device is predicted prior to the occurrence of the electrical arc such that the electrical protection device is well equipped to handle the electrical arc. More specifically, the electrical protection device is configured to dynamically perform data analysis on data related to the electrical circuit in real-time for detecting electrical signatures in the data that indicate an upcoming electrical arc. In general, systems performing such data driven analysis may be utilized in any electrical protection or distribution systems where arc signatures are observed, for example, industrial and residential circuit breakers, switch gears, load centers, motor control centers and BMS etc., that are being controlled by electronic trip or control circuit with real time data measuring capabilities. Moreover, as the data analysis is performed in real-time, hence is field adoptable and dynamic in nature ensuring early prediction of electrical arc in the electrical protection device. The electrical protection device for predicting electrical arcs is explained in detail next with reference to FIG. 2.

Figure 2:
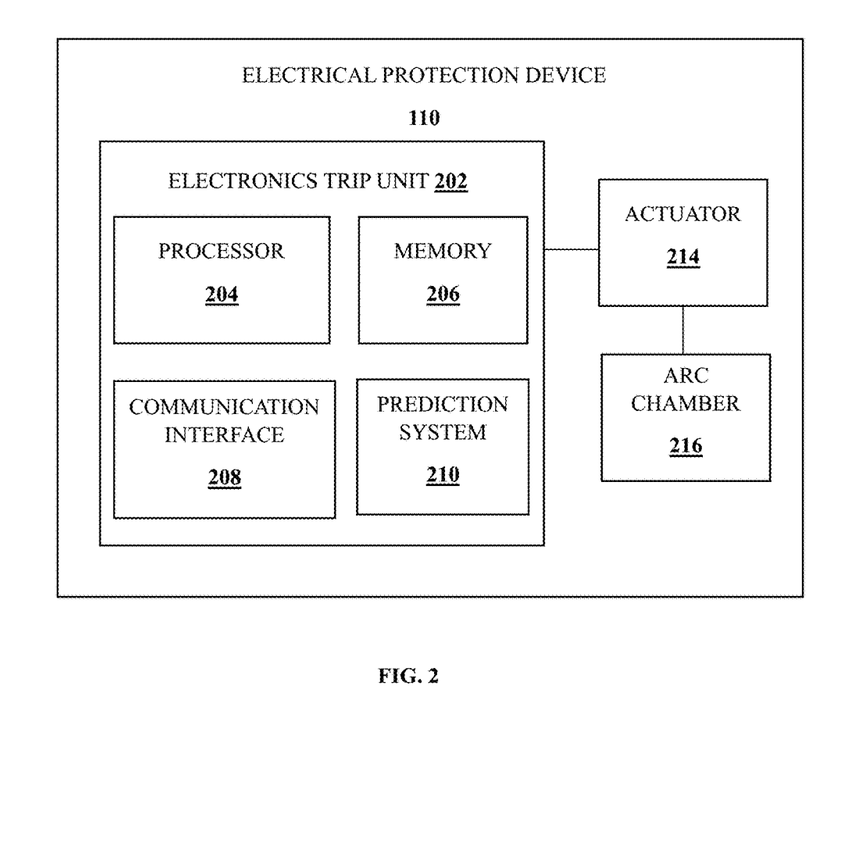
FIG. 2 is a schematic block diagram of an electrical protection device for predicting electrical arcs, in accordance with an embodiment of the present disclosure.

FIG. 2 illustrates the electrical protection device 110 for predicting electrical arcs, in accordance with an embodiment of the present disclosure. The electrical protection device 110 is an example of the electrical protection device 110 and is depicted to include an electronic trip unit 202, an actuator 214 and an arc chamber 216. The electronic trip unit 202 includes a processor 204, a memory 206, a communication interface 208, a prediction system 210, and a trip control circuit 212. However, it shall be noted that in some embodiments, the electrical protection device 110 may include more or fewer components than those depicted herein.

The term 'electrical signature' as used herein refers to a pattern of an electrical signal related to the electrical circuit representing a specific behavior of the electrical circuit. In other words, the electrical signature captures a chaotic behavior of the electrical circuit for variations in voltage, current, etc. In this disclosure, the electrical signature (i.e., drastic change in voltage, current or power) is used to identify upcoming electrical arcs in the electrical circuit. Such electrical signature may be observed in any electrical circuit deployed in residential or commercial distribution systems such as, industrial, and residential circuit breakers, switch gears, load centers, motor control centers and BMS etc. that are being controlled by electronics trip unit with real time data measuring capabilities.

In one embodiment, the processor 204 may be embodied as a multi-core processor, a single core processor, or a combination of one or more multi-core processors and one or more single core processors. For example, the processor 204 may be embodied as one or more of various processing devices, such as a coprocessor, a microprocessor, a controller, a digital signal processor (DSP), a processing circuitry with or without an accompanying DSP, or various other processing devices including, a microcontroller unit (MCU), a hardware accelerator, a special-purpose computer chip, or the like.

In one embodiment, the memory 206 is capable of storing machine executable instructions, referred to herein as instructions 207. In an embodiment, the processor 204 is embodied as an executor of software instructions. As such, the processor 204 is capable of executing the instructions 207 stored in the memory 206 to perform one or more operations described herein.

Figure 4:
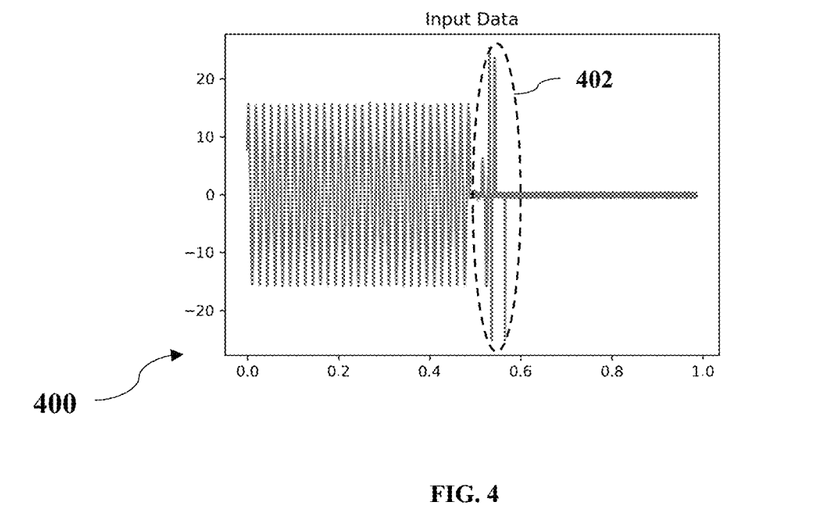
FIG. 4 is a plot of time series data of line current measured in the electric circuit, in accordance with an embodiment of the present disclosure.

In an embodiment, the communication interface 208 may include mechanisms configured to communicate with other entities in the environment 100. In other words, the communication interface 208 is an Input/Output interface configured to collate data for processing by the processor 202 or the prediction system 208. For example, the communication interface 208 is configured to receive data related to the electric circuit such as, time series data of the electrical circuit. More specifically, any data from the electrical circuit indicating an electrical signature signifying an upcoming arc may be captured as time series data. Some examples of the time series data of the electrical circuit include, but not limited to, current values, voltage values, power values, energy values, and the like in the electrical circuit. The time series data are measurements in the electronics trip unit 202 and are readily available in a time series format for the data analysis in a sequential window train to detect electrical signatures. An example of time series data of line current measured in a Dual Function Circuit Interrupter (DFCI) NEMA breaker is depicted in plot 400 of FIG. 4. As seen from FIG. 4, the time series data of line current indicates an upcoming electrical arc 402 that may be determined by further data analysis. It shall be noted that even though current values have been plotted in FIG. 4, any time series data relating to the electrical circuit such as, but not limited to, voltage values, power values, energy values indicative of the electrical signature signifying the upcoming electrical arc 402 may be used for data analysis in predicting the electrical signature. In an embodiment, the time series data is forwarded to the processor 204 which performs one or more operations described herein to detect an electrical signature indicating the upcoming electrical arc 402 in the electrical circuit. In another embodiment, the time series data is forwarded to the prediction system 210.

The prediction system 210 is configured to predict electrical arcs in the electrical protection device 110 connected in an electrical circuit. More specifically, the prediction system 210 detects an electrical signature in the time series data that indicates an upcoming electrical arc and predicts the electrical arc based on the electrical signature. The prediction system 210 is explained in detail with reference to FIG. 3.

Figure 3:
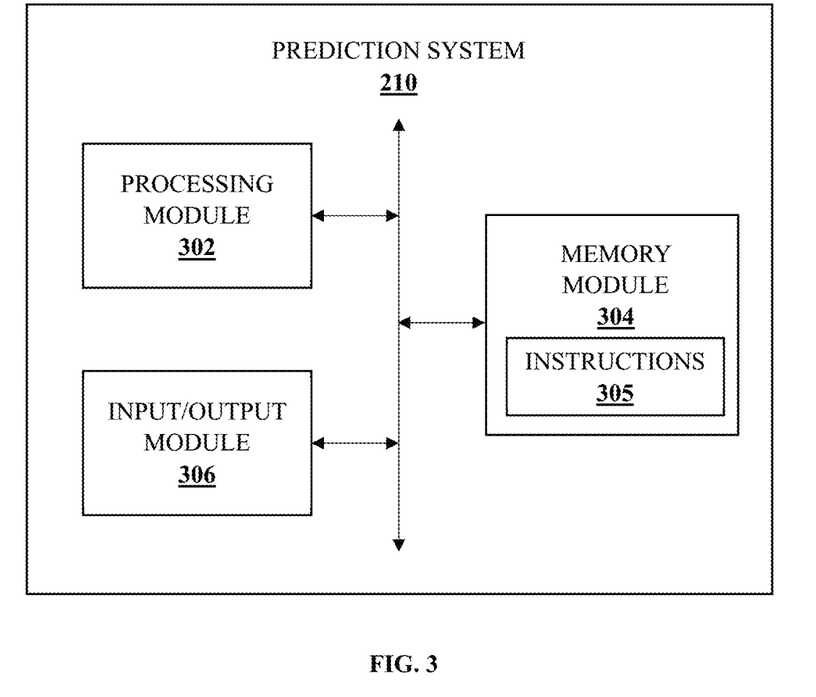
FIG. 3 is a schematic block diagram of a prediction system for predicting electrical arcs in the electrical protection device of FIG. 2 connected in an electric circuit, in accordance with an embodiment of the present disclosure.

FIG. 3 illustrates the prediction system 210 for predicting electrical arcs in the electrical protection device 110 of FIG. 2 connected in an electric circuit, in accordance with an embodiment of the present disclosure. In an embodiment, the prediction system 210 may be embodied in the processor 204 of the electronics trip unit 202 configured within the electrical protection device 110. In another embodiment, the prediction system 210 may be configured as a standalone component communicably coupled to the processor 204 of the electronics trip unit 202 capable of performing one or more operations described herein. In yet another embodiment, the prediction system 210 may be configured on an edge device having data processing capabilities and is close wired to the electrical protection device 110 to avoid traffic time.

The prediction system 210 includes a processing module 302, a memory module 304 and an Input/Output (I/O) module 306. Further, two or more modules may be embodied in one single module, and/or one module may be configured using multiple sub-components to achieve the desired functionalities. The various modules of the prediction system 210 may be implemented using hardware, software, firmware, or any combinations thereof. The modules of the prediction system 210 provided herein may not be exhaustive, and that the prediction system 210 may include more or fewer modules than that depicted in FIG. 3. Further, the various components of the prediction system 210 may be operably coupled with each other. More specifically, various components of the prediction system 210 may be capable of communicating with each other using communication channel media (such as buses, interconnects, etc.).

The memory module 304 can be any type of storage accessible to the processing module 302 to perform respective functionalities, as will be explained in detail with reference to FIGS. 3 to 6. For example, the memory module 304 may include one or more volatile or non-volatile memories, or a combination thereof. For example, the memory module 304 may be embodied as semiconductor memories, such as flash memory, mask ROM, PROM (programmable ROM), EPROM (erasable PROM), RAM (random access memory), etc. and the like.

In one embodiment, the memory module 304 is capable of storing machine executable instructions, referred to herein as instructions 305. In an embodiment, the processing module 302 is configured to execute the instructions 305 for: (1) constructing a Hankel matrix using the time series data, (2) performing a singular value decomposition on the Hankel matrix to obtain at least one singular vector, (3) performing delay coordinate embedding on the at least one singular vector to generate at least one reconstructed singular vector, (4) calculating a threshold coefficient 'r' from the at least one reconstructed singular vector, (5) identifying a first set of eigen time delay coordinates, (5) computing a rate of change in magnitude of the first set of eigen time delay coordinates, (6) detecting an electrical signature based on the rate of change in magnitude, (7) predicting the upcoming electrical arc in the electrical circuit based on the electrical signature.

The I/O module 306 is configured to receive inputs from and provide outputs to other entities such as, the communication interface 208 of the electronics trip unit 202. In an embodiment, the I/O module 306 is configured to receive the time series data from the communication interface 208 of the electronics trip unit 202. In an illustrative example, the time series data is a sampled data received at predefined intervals from the electrical circuit, for example, current values obtained every 5 ms from the electrical circuit. The I/O module 306 forwards the time series data to the processing module 304. The processing module 302 in conjunction with the instructions 305 stored in the memory module 304 is configured to process the time series data for detecting an electrical signature indicating an upcoming electrical arc in the electrical circuit. In other words, the dynamical behavior of the electrical protection device 110 connected in the electrical circuit is analyzed for predicting the upcoming electrical arc.

In an embodiment, the processing module 302 is configured to construct a Hankel matrix (H) using the time series data. In an illustrative example, current values are received as the time series data for timesteps t=1, 2, 3, . . . , n. The Hankel matrix is a square matrix with constant skew diagonals and dimensions m×m. As the data analysis is dynamically performed in real-time, the Hankel matrix (H) is dynamically updated based on the time series data collated from the electrical circuit while the dimension of the Hankel matrix (H) is fixed at m×m. In an illustrative example, at t=10, a Hankel matrix (H) with dimensions 10×10 may be constructed with time series data obtained from timestep t=0 to t=10 and at a timestep t=11, the Hankel matrix (H) will be updated with time series data collated from t=1 to t=11. In such cases, time series data obtained at the timestep t=0 may be excluded from the Hankel matrix (H).

In an embodiment, the processing module 302 is configured to perform a singular value decomposition on the Hankel matrix (H) to obtain at least one singular vector. In general, the Hankel matrix is factorized to form three different component matrices. For example, the Hankel matrix (H) is decomposed to obtain a left singular vector (U), a singular value matrix $\Sigma$ (i.e., diagonal elements are singular values), and a right singular vector (V) as shown below by Equation (1).

$$H = U\Sigma V^T \tag{1}$$

The right singular vector (U) and the left singular vector (V) include eigen coordinates. Further, the processing module 302 is configured to perform delay coordinate embedding on the at least one singular vector (U or V) to generate at least one reconstructed singular vector. In an embodiment, delay coordinate embedding is performed on the right singular vector (V) to generate the at least one reconstructed singular vector (R). More specifically, phase space reconstruction is used for reconstructing dynamics of the electrical protection device 110 using the time series data. In one embodiment, Takens' delay embedding is used for reconstructing the dynamics of the electrical protection device 110 which displays various essential properties of the time series data. As such, the at least one singular vector, for example, a right singular vector (V) representing a chaotic system can be regenerated into multidimensional vectors series based on delay coordinate embedding. In one embodiment, the eigen coordinates of the right singular vector (V) are embedded with a time delay or lag, for example, $\tau=1$ and embedded dimension of $d=5$ to generate the reconstructed singular vector (R). As such, the reconstructed singular vector (R) includes a plurality of eigen time delay coordinates.

In an embodiment, a threshold coefficient 'r' is calculated from the at least one reconstructed singular vector (R), for example, from the right singular vector (V). More specifically, 'r' is an optimal singular value hard threshold coefficient which indicates an optimal location in the at least one reconstructed singular vector (R) representing a dynamical change in behavior of the electrical circuit. Moreover, the threshold coefficient 'r' is used to recover a low-rank matrix from the at least one reconstructed singular vector (R). For example, hard thresholding may be performed on the at least one reconstructed singular vector (R) based on the optimum singular value hard threshold coefficient. In general, eigen time delay coordinates in the at least one reconstructed singular vector (R) below a prescribed threshold $\lambda$ are set to 0. More specifically, the threshold coefficient 'r' identifies a point in the reconstructed singular vector (R) at which a response of the electric circuit changes from a linear response to a chaotic response.

In another embodiment, governing equations may be determined to predict a behaviour of the electrical protection device 110. More specifically, sparse regression may be used to determine the upcoming electrical arc in the electrical protection device 110. As such, the governing equation can be obtained by advancing the second set of coordinates (i.e., first r−1 eigen time delay coordinates in the reconstructed singular vector R) through time using the first set of eigen time delay coordinates from the previous timestep utilizing the framework of spare regression dynamic technique. The sparse regression dynamic technique is used to determine fewest terms in the governing equation required to accurately represent the behavior of the electrical protection device 110. Moreover, a visual representation of the dynamical behaviour of the electrical protection device 110 may be determined using phase space reconstruction. In other words, the phase space reconstruction represents the time evolution of a system (i.e., the electrical protection device 110) in some phase space.

In an embodiment, a first set of eigen time delay coordinates and a second set of eigen time delay coordinates are identified from the at least one reconstructed singular vector (R) based on the threshold coefficient 'r'. More specifically, a low rank matrix of reduced dimension, for example, p×p is recovered from the reconstructed singular vector (R) of dimension m×m (i.e., m<p) based on the threshold coefficient 'r'. In an embodiment, $r^{th}$ eigen time delay coordinates constitute the first set of eigen time delay coordinates and eigen time delay coordinates preceding the $r^{th}$ eigen time delay coordinates (i.e., first r−1 eigen time delay coordinates) constitute a second set of eigen time delay coordinates. In an embodiment, the first set of eigen time delay coordinates are indicative of an electrical signature signifying the upcoming electrical arc and the second set of eigen time delay coordinates represent a linear response of the electrical protection device 110. In other words, the second set of eigen time delay coordinates is the forcing operator advancing through time and the first set of eigen time delay coordinates (i.e., eigen time delay coordinates in the $r^{th}$ column) indicate a non-linear response of the electrical protection device 110. Accordingly, a forcing statistic may be determined from the first set of eigen time delay coordinates indicating the electrical signature that represents the upcoming electrical arc in the electrical protection device.

In an embodiment, the processing module 302 is configured to compute the forcing statistic as a rate of change in magnitude of the first set of eigen time delay coordinates for detecting the electrical signature. In other words, the forcing statistics captures the dynamic evolution of the electrical protection device 110 with time using differential equations. When the rate of change in magnitude of the first set of eigen time delay coordinates deviates from a reference value, the electrical signature may be detected from the time series data. For example, if the rate of change in magnitude of the first set of eigen time delay coordinates exceeds the reference value, the corresponding time series data may indicate the electrical behavior for the upcoming electrical arc. In an embodiment, the reference value is determined based, at least in part, on a rate of change in magnitude computed at one or more preceding timesteps. In one illustrative example, the average rate of change in magnitude computed based on previous 2 timesteps (for example, timesteps $t_3$, $t_4$) is 0.02. Accordingly, the reference value for a current timestep $t_5$ is 0.02 and as such, if the rate of change in magnitude of the first set of eigen time delay coordinates computed at the timestep $t_5$ exceeds 0.02, then the electrical signature indicating the upcoming electrical arc is detected from a corresponding time series data. It shall be noted that the reference values quoted above and the deviation defined as exceeding reference value is for exemplary purpose only and the reference value may be computed based on deviation in more than two timesteps and the rate of change of magnitude may be less than the reference value to indicate the upcoming electrical arc. A plot of the first set of eigen time delay coordinates and corresponding forcing statistic is shown and explained next with reference to FIG. 5.

Figure 5:
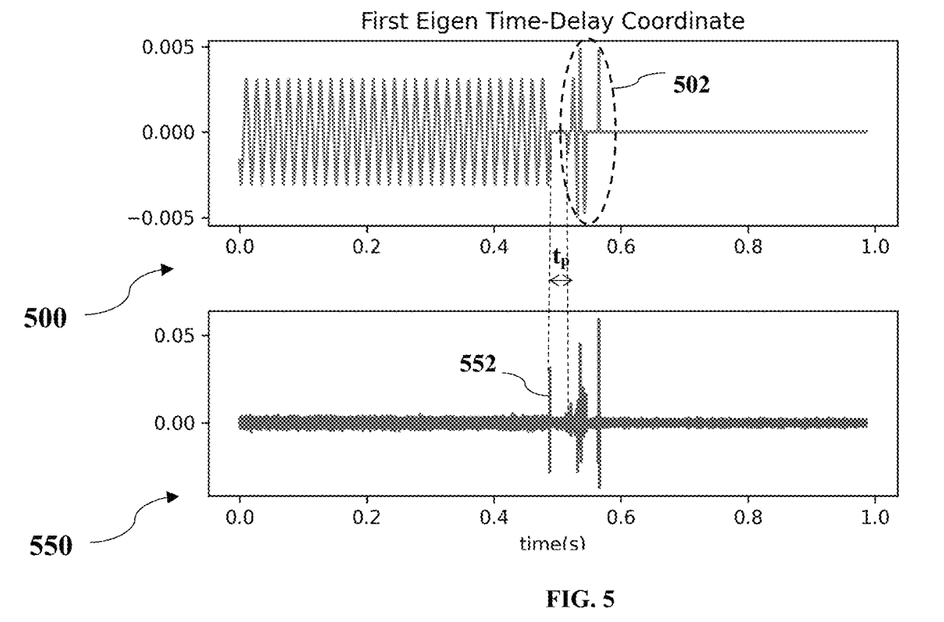
FIG. 5 includes plots of a first set of eigen time delay coordinates and corresponding forcing statistics, respectively indicating the upcoming electrical arc, in accordance with an embodiment of the present disclosure.

FIG. 5 illustrates plots 500, 550 of the first set of eigen time delay coordinates and corresponding forcing statistics indicating an electrical signature 552, respectively, in accordance with some embodiments of the present disclosure. The graph 500 of the first set of eigen time delay coordinates depict an upcoming electrical arc 502.

As already explained, the first set of eigen time delay coordinates are the $r^{th}$ eigen time delay coordinates in the at least one reconstructed singular vector and indicate the electrical signature 552 signifying the upcoming electrical arc. In general, the threshold coefficient 'r' identifies a point in the reconstructed singular vector at which a response of the electric circuit changes from a linear response to a chaotic response. In other words, the second set of eigen time delay coordinates is the forcing operator advancing through time and the first set of eigen time delay coordinates (i.e., eigen time delay coordinates in the $r^{th}$ column) indicate a non-linear response of the electrical protection device 110. The forcing statistic in the plot 550 may be determined from the first set of eigen time delay coordinates and indicates the electrical signature 552 that represents the upcoming electrical arc 502 in the electrical protection device 110. In an embodiment, a rate of change in magnitude of the first set of eigen time delay coordinates gives the forcing statistics.

Figure 6:
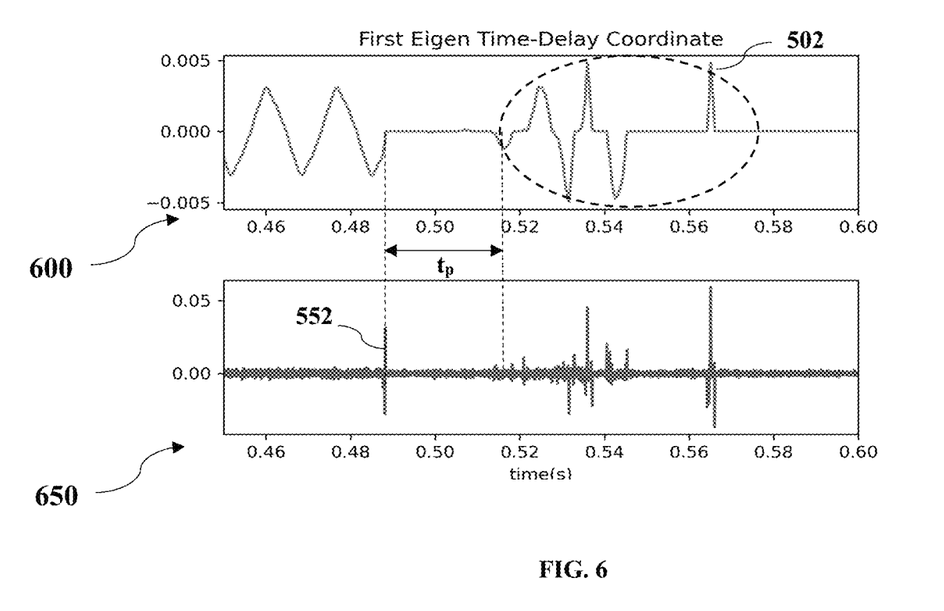
FIG. 6 includes enlarged portions of the plots of FIG. 5 to depict an electrical signature appearing before the electrical arc, in accordance with an embodiment of the present disclosure.

As seen from FIG. 5, the electrical signature 552 is observed in the plot 550 when the rate of change in magnitude of the first set of eigen time delay coordinates (i.e., the forcing statistics) deviates from a reference value, for example, 0.01. The reference value may be determined based on a rate of change in magnitude computed at one or more preceding timesteps, for example, reference value at t=0.44 may be computed based on the rate of change in magnitude at t=0.43, t=0.42 and t=0.41 (i.e., preceding three timesteps). As seen from FIG. 5, the electrical signature 552 appears 'tp' seconds ahead of the electrical arc 502 and thereby, the electrical protection device 110 is well equipped or prepared in advance to handle the electrical arc 502. An enlarged portion of the plots 500 and 550 is depicted as plots 600 and 650, respectively in FIG. 6. As shown in FIG. 6 the electrical arc appears at least 0.03 seconds ahead of the electrical arc thereby ensuring the electrical protection device 110 has sufficient time to prepare for handling the electrical arc 502 which ensures averting of serious fires, loss of lives or damage to property.

It shall be noted that the plots 500, 550, 600 and 650 are exemplary and the plots 550 and 650 indicates the electrical signature 552 when the rate of change in magnitude of the first set of eigen time delay coordinates exceeds a reference value. However, it shall be noted that electrical signatures may also be observed when the rate of change in magnitude of the first set of eigen time delay coordinates is lesser than the reference value in some cases.

Referring now to FIG. 3, the processing module 302 is configured to predict the upcoming electrical arc in the electrical circuit based on the electrical signature. More specifically, deep neural networks or machine learning models may be used to predict the upcoming electrical arc based on the electrical signature. In one illustrative example, a linear regression model may be trained using training data for predicting electrical arcs based on a plurality of electrical signatures. Some examples of the deep neural networks include, but not limited to, Support Vector Machine, Naive Bayes classifier, Logistic Regression, Convolutional Neural Networks (CNN) and the like. Thereafter, the processing module 302 is configured to generate a control signal based on the prediction. More specifically, the processing module 302 generates a control signal for quenching the electrical arc. In an embodiment, the processing module 302 is configured to provide the control signal to the trip control circuit 210. In another embodiment, when the prediction system 210 is configured on an edge device and operably coupled to the electrical protection device 110, the processing module 302 is configured to provide the control signal to processor 204 which forwards the control signal to the trip control circuit 210.

Referring now to FIG. 2, the trip control circuit 210 of the electronic trip unit 202 is configured to generate a tripping signal for operating the actuator 212. In general, the tripping signal is a predefined voltage level which will energize or power the actuator 212. In one illustrative example, on detecting the electrical signature, the tripping signal will be a 12V which will power the actuator 212. As such, the actuator 212 is configured to disconnect the electrical protection device 110 from the load 106 while ensuring the arc chamber 216 is prepared to handle the electrical arc. In one illustrative example, home appliances in a residence may be disconnected from the electrical protection device 110 to avoid electrical hazards. More specifically, a mechanical motion, such as, linear or rotary of the actuator 214 is configured to connect the electrical protection device to the arc chamber 216 for quenching the electrical arc and disconnecting line supplying the load 106. Some examples of the actuator 212 include, but not limited to, mechanical, electro mechanical, hydraulic, pneumatic, piezoelectric or any combination thereof. It shall be noted that any arc chamber such as, but not limited to, DFCI, sulfur hexafluoride, oil circuit breaker, vacuum circuit breaker, high-voltage circuit breaker, and the like may be utilized to disconnect the electrical protection device 110 from the home appliances in the load 106.

In one illustrative example, the arc chamber 216 is configured to split an electric arc into several smaller arcs until the driving voltage is no longer sufficient and they are extinguished. As the electrical arc is predicted ahead of time based on the electrical signature, the arc chamber 216 is well prepared to handle the electrical arc much ahead of time, for example, a few seconds ahead of the electrical arc and thereby ensuring safe distribution of supply to residential and commercial infrastructures. Moreover, prediction of such extreme events ahead in time aids the electrical protection device 110 to plan and handle the upcoming electrical arc better preventing loss of property and human lives.

It shall be noted that although the electrical protection device 110 is explained with reference to a residential infrastructure, various embodiments of the present disclosure may also be used in commercial or industrial infrastructures without departing from the scope of the present disclosure. A method for identifying electrical signatures that indicate an upcoming electrical arc and predicting the electrical arc is explained next with reference to FIG. 7.

Figure 7:
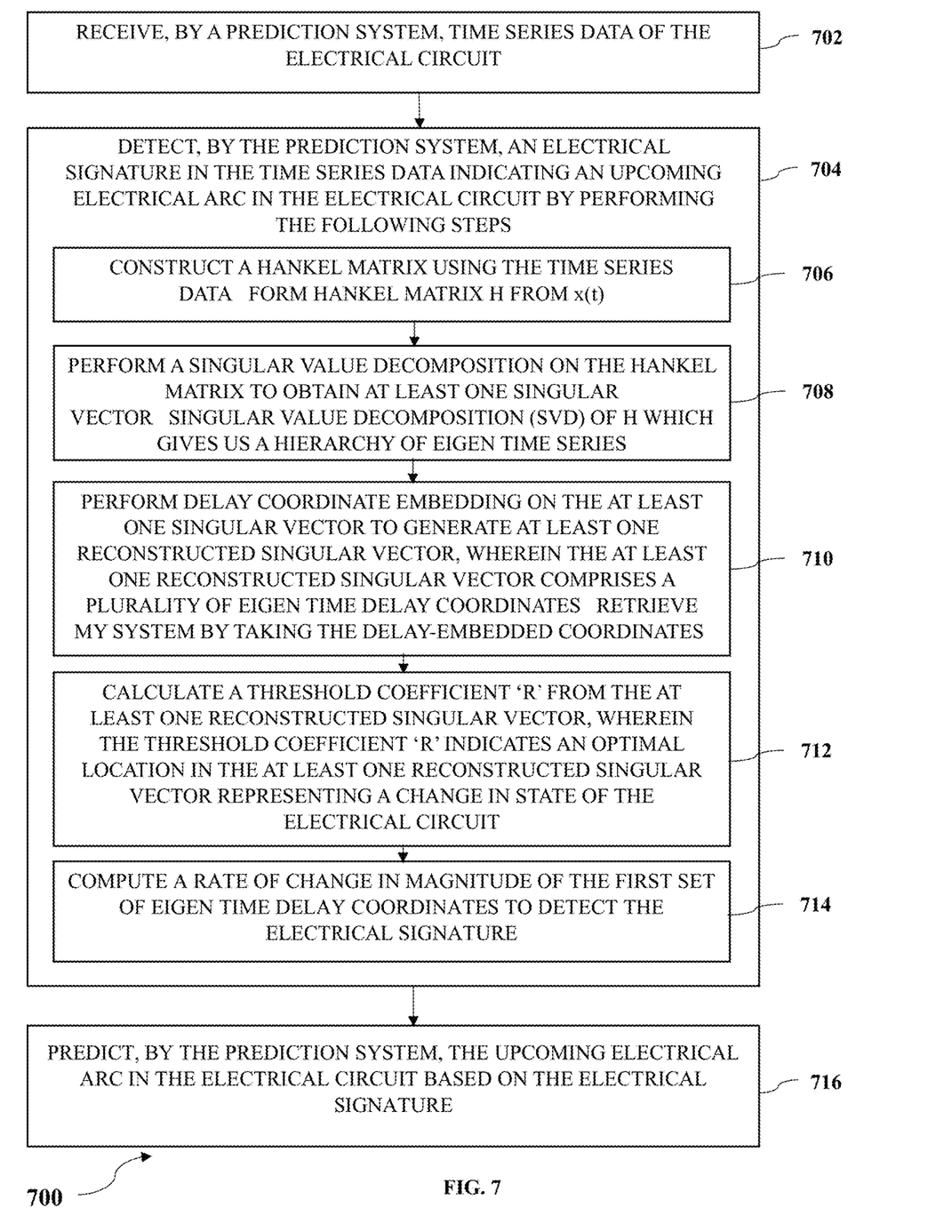
FIG. 7 is a flowchart illustrating a method for predicting electrical arcs in an electrical protection device connected in an electric circuit, in accordance with an embodiment of the present disclosure.

FIG. 7 is a flowchart illustrating a method 700 for predicting electrical arcs in an electrical protection device connected in an electric circuit, in accordance with an embodiment of the present disclosure. The method 700 depicted in the flow diagram may be executed by, for example, the processing module (also referred as processor in the present disclosure) of the electrical protection device 110 or the prediction system 210. Operations of the flow diagram, and combinations of operation in the flow diagram, may be implemented by, for example, hardware, firmware, a processor, circuitry and/or a different device associated with the execution of software that includes one or more computer program instructions. The operations of the method 700 are described herein with help of the prediction system 210. It is noted that the operations of the method 700 can be described and/or practiced by using one or more processors of a system/device other than the prediction system 210, such as the processor 202 of the electrical protection device 110. The method 700 starts at operation 702

At operation 702 of the method 700, time series data of the electrical circuit is received by a system such as, the prediction system 210 shown and explained with reference to FIG. 3. As already explained, the prediction system 210 may be embodied within the processor (i.e., the processor 204) of the electronics trip unit 202 or maybe configured as a standalone processor configured to perform one or more of the operations herein. In some embodiments, the prediction system 210 may be configured on an edge device having data processing capabilities and is close wired to the electrical protection device 110 to avoid cloud traffic time.

At operation 704 of the method 700, an electrical signature is detected in the time series data. The electrical signature corresponds to at least a portion of an electrical signal related to the electrical circuit (i.e., the time series data) representing an anomalous behavior of the electrical circuit indicating an upcoming electrical arc. The electrical signature indicates an upcoming electrical arc in the electrical circuit by performing operations 706-716.

At operation 706 of the method 700, a Hankel matrix is constructed using the time series data. The Hankel matrix is a square matrix in which time-series data are stacked by advancing each timeseries data by one measurement at each level (i.e., row of the Hankel matrix). In other words, the time series data in the Hankel matrix are arranged such that elements of the skew diagonals are identical. Moreover, the Hankel matrix is dynamically updated with the time-series data and time-series data collated much preceding a current timestep are discarded.

At operation 708 of the method 700, a singular value decomposition is performed on the Hankel matrix to obtain at least one singular vector. In general, the Hankel matrix is factorized to form three different component matrices to obtain a left singular vector (U), a singular value matrix $\Sigma$ (i.e., diagonal elements are singular values), and a right singular vector (V) as shown below by Equation (1).

At operation 710 of the method 700, delay coordinate embedding is performed on the at least one singular vector to generate at least one reconstructed singular vector. In an embodiment, delay coordinate embedding is performed on the at least one singular vector (e.g., the right singular vector (V)) to generate at least one reconstructed singular vector (R). For example, the eigen coordinates of the right singular vector (V) are embedded with a time delay or lag, for example, $\tau=1$ and embedded dimension of 'd' to generate the reconstructed singular vector (R). As such, the reconstructed singular vector (R) includes a plurality of eigen time delay coordinates.

At operation 712 of the method 700, a threshold coefficient 'r' is calculated from the at least one reconstructed singular vector. In an embodiment, an optimum singular value hard threshold coefficient may be used to recover a low-rank matrix from the at least one reconstructed singular vector (R) based on the threshold coefficient 'r'. The threshold coefficient 'r' indicates an optimal location in the at least one reconstructed singular vector representing a change in state of the electrical circuit from a linear response to a chaotic response.

At operation 714 of the method 700, a first set of eigen time delay coordinates is identified from among the plurality of eigen time delay coordinates in the at least one reconstructed singular vector based on the threshold coefficient 'r'. In an embodiment, $r^{th}$ eigen time delay coordinates constitute the first set of eigen time delay coordinates and eigen time delay coordinates preceding the $r^{th}$ eigen time delay coordinates (i.e., first r−1 eigen time delay coordinates) constitute a second set of eigen time delay coordinates. The first set of eigen time delay coordinates indicate an electrical signature signifying the upcoming electrical arc and the second set of eigen time delay coordinates represent a linear response of the electrical protection device 110. In other words, the second set of eigen time delay coordinates is the forcing operator advancing through time and the first set of eigen time delay coordinates (i.e., eigen time delay coordinates in the $r^{th}$ column) indicate a non-linear or chaotic response of the electrical protection device 110.

At operation 716 of the method 700, a rate of change in magnitude of the first set of eigen time delay coordinates is calculated to detect the electrical signature. Accordingly, a forcing statistic may be determined from the first set of eigen time delay coordinates indicating the electrical signature that represents the upcoming electrical arc in the electrical protection device 110. In other words, the forcing statistics captures the dynamic evolution of the electrical protection device 110 with time using differential equations. When the rate of change in magnitude of the first set of eigen time delay coordinates deviates from a reference value, the electrical signature may be detected from the time series data. For example, if the rate of change in magnitude of the first set of eigen time delay coordinates exceeds/falls below the reference value, the corresponding time series data may indicate the electrical signature for the upcoming electrical arc. In an embodiment, the reference value is determined based, at least in part, on a rate of change in magnitude computed at one or more preceding timesteps.

At operation 718 of the method 700, the upcoming electrical arc in the electrical circuit is predicted based on the electrical signature. Machine learning models and neural networks may be used to predict a likelihood of the electrical arc ahead of time based on the electrical signature.

In an embodiment, the prediction system 210 is configured to generate a control signal for operating an actuator such as, the actuator 212 (shown in FIG. 2). The actuator is configured to disconnect power supply to residential or commercial structures and quench the electrical arc in the arc chamber. More specifically, the actuator is configured to disconnect the electrical protection device from the residential or commercial structures thereby preventing house fires and loss of human lives and property.

The sequence of operations of the method 700 need not be necessarily executed in the same order as they are presented. Further, one or more operations may be grouped together and performed in form of a single step, or one operation may have several sub-steps that may be performed in parallel or in sequential manner.

The disclosed methods with reference to FIGS. 1 to 7, or one or more operations of the flow diagram 700 may be implemented using software including computer-executable instructions stored on one or more computer-readable media (e.g., non-transitory computer-readable media, such as one or more optical media discs, volatile memory components (e.g., DRAM or SRAM), or non-volatile memory or storage components (e.g., hard drives or solid-state non-volatile memory components, such as Flash memory components) and executed on a computer (e.g., any suitable computer, such as a laptop computer, net book, Web book, tablet computing device, smart phone, or other mobile computing device). Such software may be executed, for example, on a single local computer Various embodiments of the present disclosure provide numerous advantages. Embodiments of the present disclosure provide a data driven analysis for predicting electrical arcs ahead of time. Such prediction blocks (i.e., the prediction system 210) may be integrated into existing electronics trip unit such that the real time data is fed to the block in the electronics trip unit to predict arc fault ahead in time. Moreover, such early prediction of electrical arcs based on electrical signatures ensures the electrical protection device is well prepared to handle extreme events thereby, preventing loss of lives and damage to property in residential and commercial structures. More specifically, the actuator may be enabled in advance to ensure power supply to the residential or commercial structures are disconnected. In addition, electrical arrangements may be devised for quenching the electrical arcs based on such early prediction.

It will be understood by those within the art that, in general, terms used herein, and are generally intended as "open" terms (e.g., the term "including" should be interpreted as "including but not limited to," the term "having" should be interpreted as "having at least," the term "includes" should be interpreted as "includes but is not limited to," etc.). For example, as an aid to understanding, the detail description may contain usage of the introductory phrases "at least one" and "one or more" to introduce recitations. However, the use of such phrases should not be construed to imply that the introduction of a recitation by the indefinite articles "a" or "an" limits any particular part of description containing such introduced recitation to inventions containing only one such recitation, even when the introductory phrases "one or more" or "at least one" and indefinite articles such as "a" or "an" (e.g., "a" and/or "an" should typically be interpreted to mean "at least one" or "one or more") are included in the recitations; the same holds true for the use of definite articles used to introduce such recitations. In addition, even if a specific part of the introduced description recitation is explicitly recited, those skilled in the art will recognize that such recitation should typically be interpreted to mean at least the recited number (e.g., the bare recitation of "two recitations," without other modifiers, typically means at least two recitations or two or more recitations).

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the foregoing detailed description.

Preferred embodiments are described herein, including the best mode known to the inventors for carrying out the disclosure. Variations of those preferred embodiments may become apparent to those of ordinary skill in the art upon reading the foregoing description. The inventors expect skilled artisans to employ such variations as appropriate, and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the disclosure (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the disclosure and does not pose a limitation on the scope of the disclosure unless otherwise claimed. No language in the specification should be construed as indicating any non-claimed element as essential to the practice of the disclosure.

What is claimed is:

1. A method for predicting electrical arcs in an electrical protection device connected in an electrical circuit, the method comprising:
   receiving, by a processor, time series data of the electrical circuit;
   detecting, by the processor, an electrical signature in the time series data indicating an upcoming electrical arc in the electrical circuit by performing the following steps:
   constructing a Hankel matrix using the time series data;
   performing a singular value decomposition on the Hankel matrix to obtain at least one singular vector,
   performing delay coordinate embedding on the at least one singular vector to generate at least one reconstructed singular vector, wherein the at least one reconstructed singular vector comprises a plurality of eigen time delay coordinates,
   calculating a threshold coefficient 'r' from the at least one reconstructed singular vector, wherein the threshold coefficient 'r' indicates an optimal location in the at least one reconstructed singular vector representing a change in state of the electrical circuit,
   identifying a first set of eigen time delay coordinates among the plurality of eigen time delay coordinates in the at least one reconstructed singular vector based on the threshold coefficient 'r', wherein $r^{th}$ eigen time delay coordinates constitute the first set of eigen time delay coordinates, and
   computing a rate of change in magnitude of the first set of eigen time delay coordinates to detect the electrical signature,
   predicting, by the prediction system, the upcoming electrical arc in the electrical circuit based on the electrical signature; and
   generating, by the processor, a control signal to operate an actuator of the electrical protection device based on the prediction for quenching the electrical arc.

2. The method of claim 1, wherein the electrical signature is detected when the rate of change in the magnitude of the first set of coefficients deviates from a reference value.

3. The method of claim 2, wherein the reference value is determined based, at least in part, on a rate of change in magnitude computed at one or more preceding timesteps.

4. The method of claim 3, wherein eigen time delay coordinates preceding the $r^{th}$ eigen time delay coordinates constitute a second set of eigen time delay coordinates.

5. The method of claim 4, further comprising:
   performing hard thresholding on the at least one reconstructed singular vector based on an optimum singular value hard threshold coefficient; and determining the first set of eigen time delay coordinates and the second set of time delay coordinates from the at least one reconstructed singular vector.

6. The method of claim 5, wherein the second set of eigen time delay coordinates in the at least one reconstructed singular vector is advanced in time based on corresponding first set of coefficients.

7. The method of claim 6, wherein the second set of eigen time delay coordinates represent a linear response of the electrical protection device and the first set of eigen time delay coordinates represent the electrical signature.

8. The method of claim 1, wherein the time series data comprises at least one of the group consisting of: current values, voltage values, power values and energy values in the electrical circuit.

9. A prediction system for predicting electrical arcs in an electrical protection device connected in an electric circuit, the prediction system comprising:
   a memory configured to store instructions; and
   a processor configured to execute the instructions stored in the memory and thereby cause the event prediction system to:
   receive time series data of the electrical circuit;
   detect an electrical signature in the time series data indicating an upcoming electrical arc in the electrical circuit by performing the following steps:
      constructing a Hankel matrix using the time series data;
      performing a singular value decomposition on the Hankel matrix to obtain at least one singular vector,
      performing delay coordinate embedding on the at least one singular vector to generate at least one reconstructed singular vector, wherein the at least one reconstructed singular vector comprises a plurality of eigen time delay coordinates,
      calculating a threshold coefficient 'r' from the at least one reconstructed singular vector, wherein the threshold coefficient 'r' indicates an optimal location in the at least one reconstructed singular vector representing a change in state of the electrical circuit,
      identifying a first set of eigen time delay coordinates among the plurality of eigen time delay coordinates in the at least one reconstructed singular vector based on the threshold coefficient 'r', wherein $r^{th}$ eigen time delay coordinates constitute the first set of eigen time delay coordinates, and
      computing a rate of change in magnitude of the first set of eigen time delay coordinates to detect the electrical signature,
   predict the upcoming electrical arc in the electrical circuit based on the electrical signature; and
   generate a control signal to operate an actuator based on the prediction for quenching the electrical arc.

10. The prediction system of claim 9, wherein the electrical signature is detected when the rate of change in the magnitude of the first set of coefficients deviates from a reference value.

11. The prediction system of claim 10, wherein the reference value is determined based, at least in part, on a rate of change in magnitude computed at one or more preceding timesteps.

12. The prediction system of claim 11, wherein eigen time delay coordinates preceding the $r^{th}$ eigen time delay coordinates constitute a second set of eigen time delay coordinates.

13. The prediction system of claim 12, wherein the prediction system is further configured to:
   perform hard thresholding on the at least one reconstructed singular vector based on an optimum singular value hard threshold coefficient; and
   determine the first set of eigen time delay coordinates and the second set of time delay coordinates from the at least one reconstructed singular vector.

14. The prediction system of claim 13, wherein the second set of eigen time delay coordinates in the at least one reconstructed singular vector is advancing in time based on corresponding first set of coefficients.

15. The prediction system of claim 14, wherein the second set of eigen time delay coordinates represent a linear response of the electrical protection device and the first set of eigen time delay coordinates represent the electrical signature.

16. The prediction system of claim 9, wherein the time series data comprises at least one of: current values, voltage values, power values and energy values in the electrical circuit.

17. A non-transitory computer-readable medium storing instructions for predicting electrical arcs in an electrical protection device connected in an electrical circuit, the instructions when executed by a processor cause a prediction system to perform a method comprising:
   receiving time series data of the electrical circuit;
   detecting an electrical signature in the time series data indicating an upcoming electrical arc in the electrical circuit by performing the following steps:
      constructing a Hankel matrix using the time series data;
      performing a singular value decomposition on the Hankel matrix to obtain at least one singular vector,
      performing delay coordinate embedding on the at least one singular vector to generate at least one reconstructed singular vector, wherein the at least one reconstructed singular vector comprises a plurality of eigen time delay coordinates,
      calculating a threshold coefficient 'r' from the at least one reconstructed singular vector, wherein the threshold coefficient 'r' indicates an optimal location in the at least one reconstructed singular vector representing a change in state of the electrical circuit,
      identifying a first set of eigen time delay coordinates among the plurality of eigen time delay coordinates in the at least one reconstructed singular vector based on the threshold coefficient 'r', wherein $r^{th}$ eigen time delay coordinates constitute the first set of eigen time delay coordinates, and
      computing a rate of change in magnitude of the first set of eigen time delay coordinates to detect the electrical signature,
   predicting the upcoming electrical arc in the electrical circuit based on the electrical signature; and
   generating, by the processor, a control signal to operate an actuator of the electrical protection device based on the prediction for quenching the electrical arc.

* * * * *